United States Patent [19]
Kawasaki

[11] 3,944,370
[45] Mar. 16, 1976

[54] EXPOSURE TIME INDICATION APPARATUS

[75] Inventor: Masahiro Kawasaki, Tokyo, Japan

[73] Assignee: Asahi Kogaku Kogyo Kabushiki Kaisha, Tokyo, Japan

[22] Filed: Sept. 6, 1974

[21] Appl. No.: 503,925

[30] Foreign Application Priority Data
Sept. 21, 1973 Japan............................. 48-110623

[52] U.S. Cl.............. 356/226; 250/214 R; 307/311
[51] Int. Cl.² ........................................... G01J 1/44
[58] Field of Search ...... 356/226; 250/214; 307/311

[56] References Cited
UNITED STATES PATENTS

| | | | |
|---|---|---|---|
| 3,518,438 | 6/1970 | Hart et al......................... | 250/214 R |
| 3,723,014 | 3/1973 | Nanba............................... | 356/226 |
| 3,753,388 | 8/1973 | Toyoda............................ | 356/226 X |
| 3,829,866 | 8/1974 | Nobushawa..................... | 356/226 X |

Primary Examiner—John S. Heyman
Attorney, Agent, or Firm—Christie, Parker & Hale

[57] ABSTRACT

A voltage proportional to the APEX indication quantity for exposure time is coupled to one terminal of a meter through a buffer stage transistor. Circuit means produce a reference potential which is applied to the other terminal of the meter. The buffer stage transistor is biased by circuitry including a feedback stage transistor with the biasing being such that substantially constant collector current operation is ensured.

3 Claims, 3 Drawing Figures

EXPOSURE TIME INDICATION APPARATUS

BACKGROUND OF THE INVENTION

In general, this invention relates to exposure time indication apparatus of the type built into a camera. In particular, it relates to an improved buffer circuit arrangement for such apparatus.

Circuit diagrams for two different prior art arrangements are shown in FIGS. 1 and 2. As will be explained in more detail below, each of these prior art arrangements suffers from a disadvantage. Briefly, as to the prior art arrangement of FIG. 1, it is difficult to achieve good linearity. And, improvement in linearity can be achieved only at the penalty of a substantial increase in power consumption. As to the prior art arrangement of FIG. 2, this suffers from the disadvantage of undue complexity and attendant relative high manufacturing cost.

SUMMARY OF THE INVENTION

This invention is directed to eliminating the above-mentioned problems of the prior art arrangements. An advantage of an embodiment of this invention inheres in its relative simplicity, and even though simple in construction, good linearity is achieved without the need for excessive power consumption.

The apparatus of this invention includes circuit means for producing a reference potential. A two-terminal meter has one of its terminals connected to receive the reference potential. An exposure time measurement section is provided. This section includes an output stage transistor having base and emitter electrodes between which there is developed a voltage proportional to the APEX (Additive System of Photographic Exposure) indication quantity for exposure time. A buffer stage junction transistor has its base-emitter junction connected in series between the base electrode of the output stage transistor and the other terminal of the meter.

Significantly, biasing means are provided for causing the buffer stage transistor to operate with a substantially constant current. The biasing means includes a feedback stage junction transistor having its collector and base electrodes respectively connected to the emitter and collector electrodes of the buffer stage transistor. The buffer stage and feedback stage transistors are of opposite type; that is, one is an n-p-n type and the other is a p-n-p type. Preferably, the feedback stage transistor is the same type as the output stage transistor.

In the preferred embodiment, the biasing means further includes two constant current sources connected in series with the collector and emitter respectively of the buffer stage transistor.

DETAILED DESCRIPTION OF PRIOR ART ARRANGEMENTS

Figure 1:
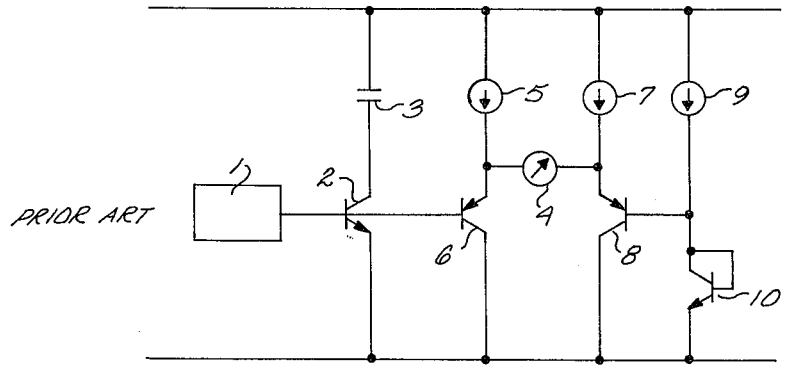
FIGS. 1 and 2 are block and schematic diagrams of prior art arrangements.

In FIG. 1, a portion of a conventional operation section is shown in block form and indicated at 1. The operation section provides for measurement of exposure time and includes an output stage transistor 2. In operation, there is developed between the base and emitter electrodes of the transistor 2 a voltage proportional to the APEX (Additive System of Photographic Exposure) indication quantity for exposure time. (Hereinafter this voltage is sometimes referred to as $V_{be1}$.) The magnitude of this voltage is related to various exposure factors such as object brightness or light quantity, film speed (ASA), and lens aperture setting ($f$No.). In the APEX system, the exposure time T is represented as the indication quantity $T_v$.

As is conventional in such an operation section, the output stage transistor 2 provides its collector current to charge a timing capacitor 3. As is well known, the resulting voltage that develops across the timing capacitor can be compared against a threshold level in connection with an operation of an electrically controlled shutter.

The remaining circuitry shown in FIG. 1 represents one typical prior art arrangement for coupling the voltage $V_{be1}$ to a two-terminal meter 4. One terminal of the meter is connected to the junction of a constant current source 5 and the emitter electrode of a transistor 6. The other terminal of the meter is connected to the junction of a constant current source 7 and the emitter electrode of a transistor 8. A reference potential is applied to the base electrode of the transistor 8. This reference potential is produced at the junction of a constant current source 9 and a transistor 10 which operates as a diode because its collector and base electrodes are directly connected together.

To analyze the performance of the prior art circuit of FIG. 1, let the base-emitter voltages of transistors 2, 6, 8, and 10 be represented by $V_{be1}$, $V_{be2}$, $V_{be3}$, and $V_{be4}$ respectively.

The voltage applied across the terminals of the meter 4 is thus expressed by the following formula:

$$Vm = V_{be1} + V_{be2} - V_{be3} - V_{be4} \ldots \qquad (1)$$

Assuming that the current flowing through the meter 4 is zero, then the base-emitter voltages $V_{be2}$, $V_{be3}$ and $V_{be4}$ are constant. Therefore, $$Vm = V_{be1} + K \ldots \qquad (2)$$

(K: constant)

The formula shows that the voltage Vm across the terminals of the meter 4 is proportional to $V_{be1}$, that is, to the APEX indication quantity $T_v$. On the other hand, when there is a current flowing through the meter ($i_m \neq 0$), the voltages $V_{be2}$ and $V_{be3}$ do not remain constant. If the changes in these voltages are represented by $\Delta V_{be2}$ and $\Delta V_{be3}$ respectively, then the following relation will be obtained.

$$Vm = V_{be1} + K + \Delta V_{be2} + \Delta V_{be3} \ldots \qquad (3)$$

It is apparent from Formula (3) that, when a current $i_m$ is flowing through the meter 4, the voltage applied across the terminals of the meter 4 is not proportional to the APEX indication quantity $T_v$. To minimize $\Delta V_{be2}$ and $\Delta V_{be3}$ caused by $i_m$, it is necessary to set the currents from the constant current sources 5 and 7 to sufficiently large values comparing with the current flowing through the meter 4. Thus, the arrangement of FIG. 1, although it has a relatively simple construction, involves a significantly large power consumption.

Figure 2:
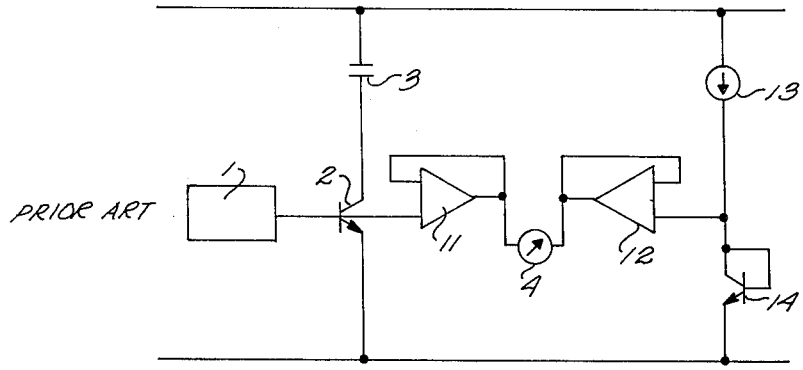

In FIG. 2 there is shown a modification of the device shown in FIG. 1, which provides an improved linearity and a reduced power consumption. In the similar manner as in the above-mentioned example, this arrangement includes an operation section 1, a transistor 2 and a timing capacitor 3. A constant current source 13 and a diode-connected transistor 14 are connected in series with each other to define a reference potential in a manner similar to the arrangement of FIG. 1. Operational amplifiers 11 and 12 are each connected to serve as a voltage follower circuit. The output terminals of the operational amplifiers 11 and 12 are each connected to an opposite terminal of the meter 4. The non-inverting input terminal of the operational amplifier 11 is connected to the base of the transistor 2, and the non-inverting input terminal of the operational amplifier 12 is connected to the junction of the constant current source 13 and the transistor 14.

In the foregoing arrangement, if the base-emitter voltages of the transistors 2 and 14 are represented by $V_{be1}$ and $V_{be5}$ respectively, then the voltage Vm across the terminals of the meter 4 will be expressed as follows:

$$Vm = V_{be1} - V_{be5} \ldots \quad (4)$$

In this formula since $V_{be5}$ is constant, then Vm will have a level proportional to $V_{be1}$, or the APEX indication quantity $T_v$, irrespective of the quantity of current flowing through the meter 4, thereby providing an ideal linear characteristic. The arrangement of FIG. 2, however, is not very convenient, because it includes an increased number of circuit components adapted for forming the operational amplifiers and therefore the circuit becomes complicated.

DETAILED DESCRIPTION OF THE PREFERRED EMBODIMENT

Figure 3:
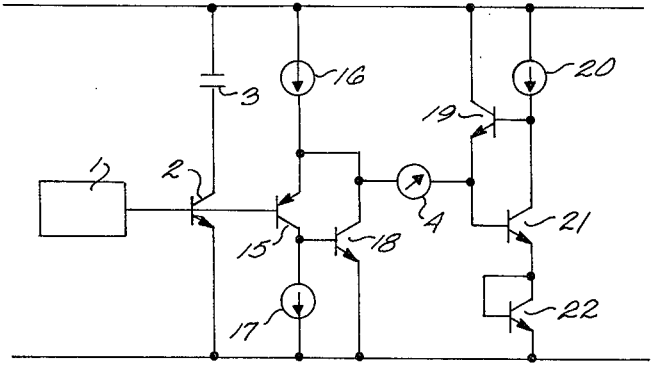
FIG. 3 is a block and schematic diagram of the preferred embodiment of this invention.

As shown in FIG. 3, there are provided an operation section 1, an output stage transistor 2, a timing capacitor 3 and a meter 4. A buffer stage junction transistor 15 has its base-emitter junction connected in series between the base of the output stage transistor and one terminal of the meter 4. The buffer stage transistor 15 is biased to operate with a substantially constant collector current. To this end, in the preferred embodiment, two constant current sources 16 and 17 are connected in series with the emitter and collector respectively of the buffer transistor 15. A feedback stage junction transistor 18 is connected to the buffer stage transistor 15. These two transistors are of opposite type. In the depicted embodiment, transistor 15 is a p-n-p type whereas transistor 18 is an n-p-n type. As shown, the collector and base electrodes of the transistor 18 are connected to the emitter and collector electrodes respectively of the transistor 15.

Circuit means are provided to develop a reference potential. To this end, a transistor 21 has its collector connected to a constant current source 20, its emitter to a diode-connected transistor 22, and its base to the emitter of a transistor 19. In turn, the collector of transistor 19 is connected to one end of said constant current source 20, and its base is connected to the other end of said constant current source 20. The meter 4 is connected at one end to the emitter of the transistor 15 and at the other end to the connecting point between the base of the transistor 21 and the emitter of the transistor 19.

Now the operation of such an arrangement will be described. If the constant current from the constant current sources 16 and 17 are represented by $i_1$ and $i_2$, the collector current of the transistor 15 by $i_3$, and the current flowing through the meter 4 by $i_m$, then the constant current $i_2$ becomes equal to the collector current $i_3$ and the transistor 18 becomes stabilized, because the transistor 18 feeds back, as the fluctuation in the collector current thereof, the difference current between $i_3$ and $i_2$ to the emitter of the transistor 15. In other words, the collector current of the transistor 18 becomes $i_1 + i_m - i_2$ and the base-emitter voltage $V_{be6}$ of the transistor 15 reaches a level corresponding to $i_2$ without being influenced by the current $i_m$ flowing through the meter 4.

Concerning the reference voltage circuit consisted of transistors 19, 21 and 22 and the constant current source 20, if the constant current from the constant current source 20 is represented by $i_4$ and the collector current of the transistor 21 by $i_5$, then the transistor 21 reaches a stabilized point where the constant current $i_4$ and the collector current $i_5$ thereof become equal in quantity, because the difference current between $i_4$ and $i_5$ is fed back to the base of the transistor 21 as a fluctuation in the base voltage of the transistor 19. That is to say, the base-emitter voltages $V_{be7}$ and $V_{be8}$ of the transistors 21 and 22 are determined only by the constant current $i_4$ and is not influenced by the current $i_m$ flowing through the meter 4. Therefore, the voltage Vm applied across the terminals of the meter 4 will be expressed as follows:

$$Vm = V_{be1} + V_{be6} - V_{be7} - V_{be8} \ldots \quad (5)$$

In this formula since each of $V_{be6}$, $V_{be7}$ and $V_{be8}$ is at a constant level irrespective of $i_m$, then Vm will be expressed as follows:

$$Vm = V_{be1} + K' \ldots \quad (6)$$

(K' : constant)

This formula shows that the voltage Vm applied across the terminals of the meter 4 is proportional to $V_{be1}'$ or the APEX indication quantity $T_v$ for the exposure time T. Thus the shutter speed can be indicated by the meter 4.

It will now be appreciated that the present invention eliminates successfully the mentioned disadvantages involved in the prior art devices as shown in FIGS. 1 and 2 and provides an improved arrangement which has a substantially reduced power consumption and improved linearity and presents a very good operation characteristic with a simple construction.

What is claimed is:
1. Exposure time indication apparatus comprising:
   circuit means for producing a reference potential;
   a two-terminal meter having one terminal connected to receive the reference potential;
   an exposure time measurement section including an output stage transistor having base and emitter electrodes between which there is developed a voltage porportional to the APEX indication quantity for exposure time;
   a buffer stage junction transistor having its base-emitter junction connected in series between the base electrode of the output stage transistor and the other terminal of the meter;

biasing means for causing the buffer stage transistor to operate with a substantially constant collector current, the biasing means including a feedback stage junction transistor having its collector and base electrode respectively connected to the emitter and collector electrodes of the buffer stage transistor; and wherein one of the buffer stage and feedback stage transistors is of the p-n-p type and the other is of the n-p-n type.

2. The apparatus of claim 1 wherein the output stage and feedback stage transistors are of the same type.

3. The apparatus of claim 1 wherein the biasing means further includes two constant current sources connected in series with the collector and emitter electrodes respectively of the buffer stage transistor.

* * * * *